(12) United States Patent
Bolton et al.

(10) Patent No.: US 7,579,920 B1
(45) Date of Patent: Aug. 25, 2009

(54) SELF-BIASING LOW-PHASE NOISE LC OSCILLATOR

(75) Inventors: Eric K. Bolton, Broomfield, CO (US); Baker P. Scott, Boulder, CO (US)

(73) Assignee: RF Micro Devices, Inc., Greensboro, NC (US)

( * ) Notice: Subject to any disclaimer, the term of this patent is extended or adjusted under 35 U.S.C. 154(b) by 69 days.

(21) Appl. No.: 11/777,726

(22) Filed: Jul. 13, 2007

(51) Int. Cl.
  *H03B 5/12* (2006.01)
(52) U.S. Cl. ............. 331/185; 331/117 FE; 331/167; 331/183
(58) Field of Classification Search .......... 331/115, 331/117 R, 117 FE, 167, 132, 182, 183, 185, 331/186
  See application file for complete search history.

(56) References Cited

U.S. PATENT DOCUMENTS

| | | | | |
|---|---|---|---|---|
| 6,064,277 | A * | 5/2000 | Gilbert | 331/117 R |
| 6,909,336 | B1 * | 6/2005 | Rajagopalan et al. | 331/183 |
| 7,327,201 | B2 * | 2/2008 | Miyashita et al. | 331/185 |
| 2003/0025566 | A1 * | 2/2003 | Rogers | 331/109 |

OTHER PUBLICATIONS

Hajimiri, Ali et al., "Design Issues in CMOS Differential LC Oscillators," IEEE Journal of Solid-State Circuits, May 1999, pp. 717-724, vol. 34, No. 5, IEEE.

Hajimiri, Ali et al., "Phase Noise in Multi-Gigahertz CMOS Ring Oscillators," Proceedings of the IEEE Custom Integrated Circuits Conference, May 1998, pp. 49-52, IEEE.

Hegazi, Emad et al., "A filtering Technique to Lower LC Oscillator Phase Noise," IEEE Journal of Solid-State Circuits, Dec. 2001, pp. 1921-1930, vol. 36, No. 12, IEEE.

Rael, J. J. et al., "Physical Processes of Phase Noise in Differential LC Oscillators," Proceedings of the IEEE 2000 Custom Integrated Circuits Conference, 2000, pp. 569-572, IEEE.

Staszewski, Robert Bogdan et al., "A Digitally Controlled Oscillator in a 90 nm Digital CMOS Process for Mobile Phones," IEEE Journal of Solid-State Circuits, Nov. 2005, pp. 2203-2211, vol. 40, No. 11, IEEE.

Xie, Dingming et al., "Phase Noise on a 2-GHz CMOS LC Oscillator," IEEE Transactions on Computer-Aided Design of Integrated Circuits and Systems, Jul. 2000, pp. 773-777, vol. 19, No. 7, IEEE.

* cited by examiner

*Primary Examiner*—Robert Pascal
*Assistant Examiner*—Ryan J. Johnson
(74) *Attorney, Agent, or Firm*—Withrow & Terranova, P.L.L.C.

(57) ABSTRACT

A self-biasing negative transconductance LC oscillator that uses self-biasing circuitry to regulate a current source that feeds negative transconductance circuitry and direct current (DC) bias circuitry to apply a DC bias between control inputs and outputs of the negative transconductance circuitry is disclosed. A current source setpoint is based on the voltage swing of the oscillator, which can then be controlled by the DC power supply that powers the oscillator. In one embodiment of the present invention, the negative transconductance circuitry includes a pair of p-type metal oxide semiconductor (PMOS) cross-coupled field effect transistors (FETs), which have a limit applied to their gate to source voltages. Limiting the gate to source voltages of the FETs limits the percentage of the oscillation cycle that the FETs spend in the triode region and thus reduces the noise contribution of the FETs and allows for less power consumption for a given noise requirement.

23 Claims, 12 Drawing Sheets

SELF-BIASING LOW-PHASE NOISE LC OSCILLATOR

FIELD OF THE INVENTION

The present invention relates to LC oscillators, which may be used in radio frequency communications circuits.

BACKGROUND OF THE INVENTION

Oscillators are commonly used in many types of electronic circuits. One type of oscillator is a negative transconductance oscillator, which uses a negative transconductance circuit coupled to a resonance circuit having a resonant frequency. The resonant circuit is often a simple passive circuit, such as an inductive-capacitive (LC) tank circuit, which naturally oscillates at its resonant frequency when provided with impedance from the negative transconductance circuit. By changing the value of the oscillator inductor (L), capacitor (C), or both, the frequency of the oscillator can be changed. The capacitance of a direct current (DC) biased varactor diode, switched capacitor bank, or both, can be changed electronically and used to provide all or part of the oscillator capacitance; therefore, a negative transconductance oscillator is often used when the frequency of the oscillator must be electronically controlled. Such oscillators are often used in frequency synthesizers that must provide output signals with programmable frequencies. RF communications circuits typically use frequency synthesizers to provide RF transmitter carrier signals, RF receiver local oscillator signals, clocking signals, or any combination thereof.

The maximum allowable phase noise of a frequency synthesizer may be restricted by RF transmitter bandwidth or noise requirements; RF receiver bandwidth, sensitivity, or noise requirements; or any combination thereof. Thus, there is a need for oscillator with reduced phase noise. Additionally, frequency synthesizers may be used in battery powered devices, or may have other restrictions on power consumption. Thus, there is a further need for an oscillator with both reduced phase noise and reduced power consumption.

SUMMARY OF THE INVENTION

The present invention claims a self-biasing negative transconductance LC oscillator that uses self-biasing circuitry to regulate a current source that feeds negative transconductance circuitry and DC bias circuitry to apply a DC bias between control inputs and outputs of the negative transconductance circuitry. A current source setpoint is based on the voltage swing of the oscillator, which can then be controlled by the magnitude of the DC power supply that powers the oscillator. The voltage swing and current consumption of the oscillator can be reduced by lowering the supply voltage; however, a larger voltage swing reduces phase noise. Therefore, the present invention enables a trade-off between phase noise and current consumption. Since the current source is self-biasing, biasing and filtering circuitry can be eliminated, further reducing current consumption, cost, and complexity.

In one embodiment of the present invention, the negative transconductance circuitry includes a pair of p-type metal oxide semiconductor (PMOS) cross-coupled field effect transistors (FETs). The sources of the FETs are coupled to the current source, the drains of the FETs provide the oscillator outputs, and the gates of the FETs are cross-coupled to the drains through capacitive elements; therefore, the gates can oscillate at a higher common mode voltage than the drains, which allows the voltage swing at the drains to be larger before the FETs enter a triode-like "on" state. When FETs enter the triode state their impedance drops significantly. This low impedance can short across the LC tank circuit reducing the quality factor (Q) of the tank and contributing noise. Limiting the magnitude of the gate to source voltage of the FETs limits the percentage of the oscillation cycle that the FETs spend in the triode region and thus reduces the noise contribution of the FETs and allows for less power consumption for a given noise requirement.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

Figure 8:
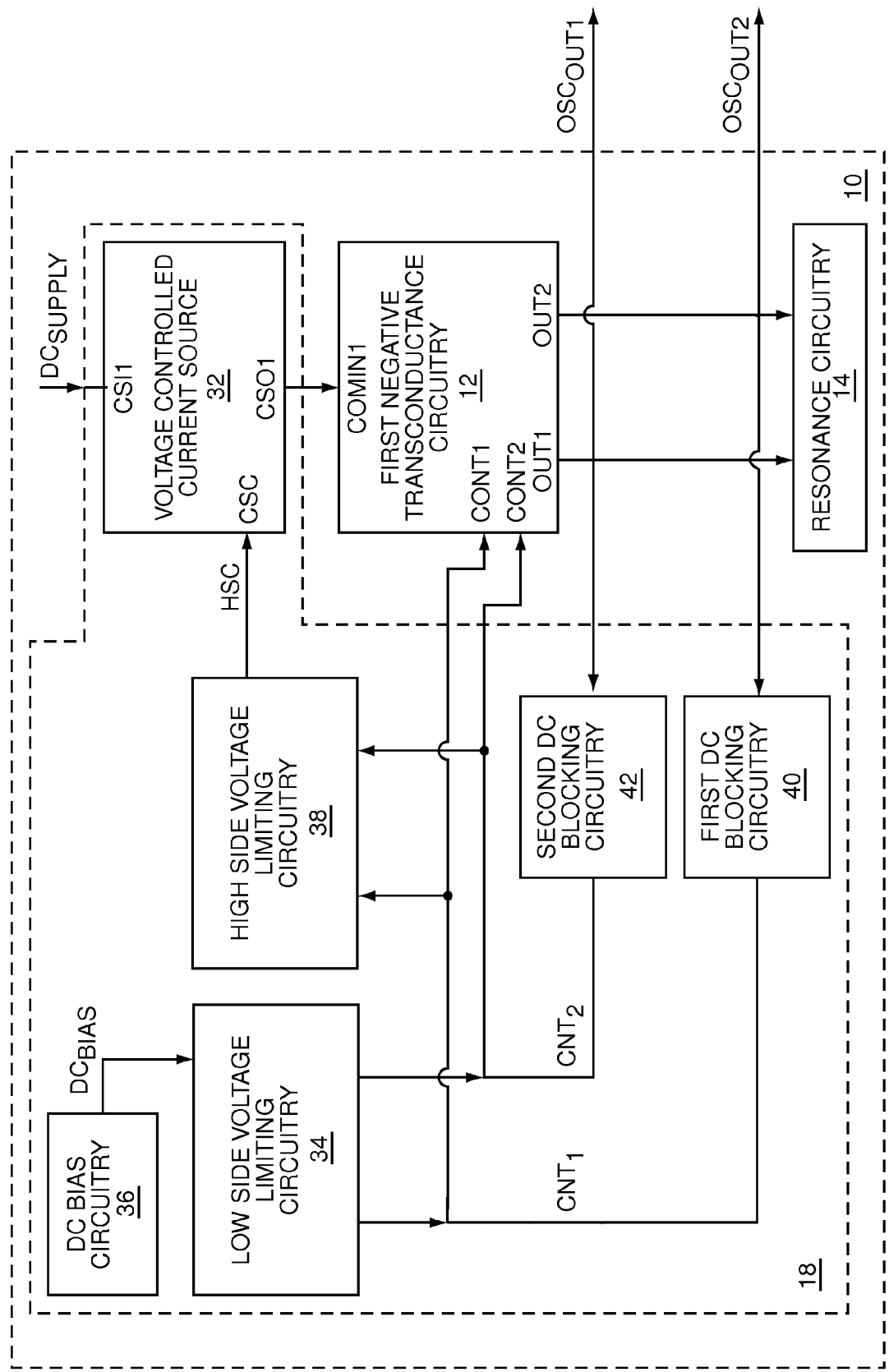
FIG. 8 shows details of the first regulated current source and DC bias circuitry illustrated in FIG. 2.
Figure 9:
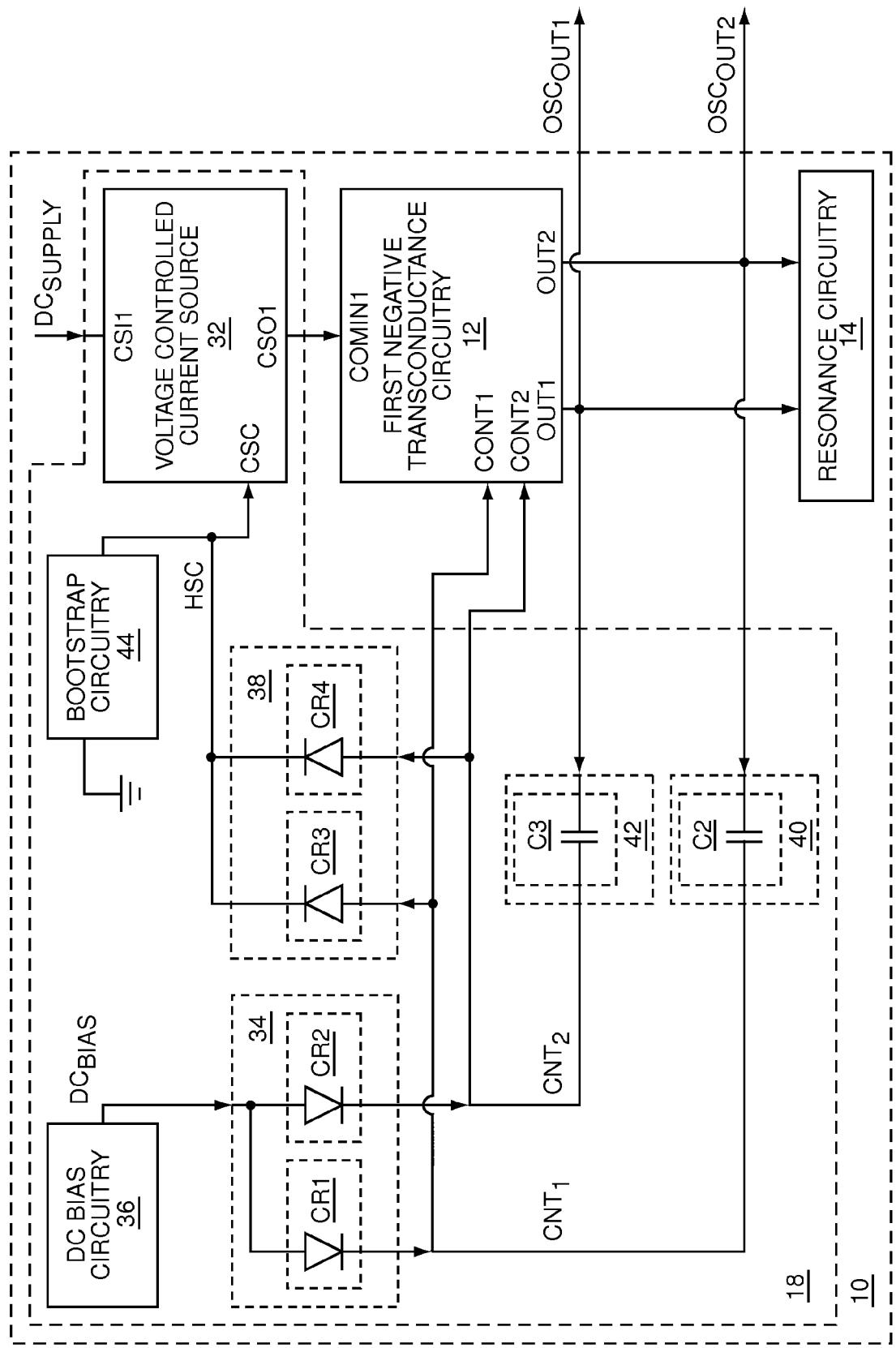

FIG. 9 adds a bootstrap circuit and shows details of the low side voltage limiting circuitry, the high side voltage limiting circuitry, the first DC blocking circuitry, and the second DC blocking circuitry illustrated in FIG. 8.

Figure 10:
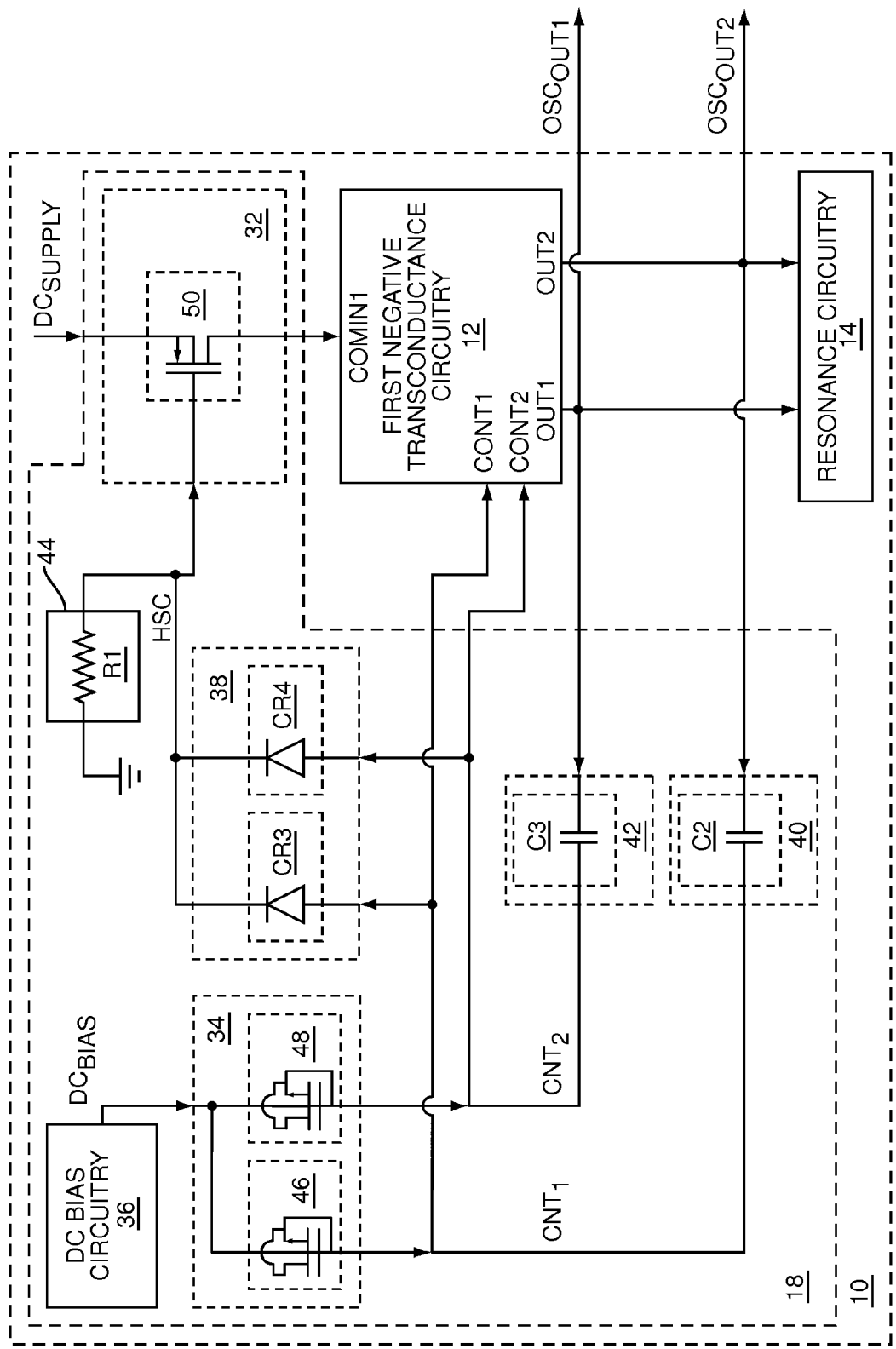

FIG. 10 shows details of the bootstrap circuitry and the voltage controlled current source illustrated in FIG. 9.

Figure 11:
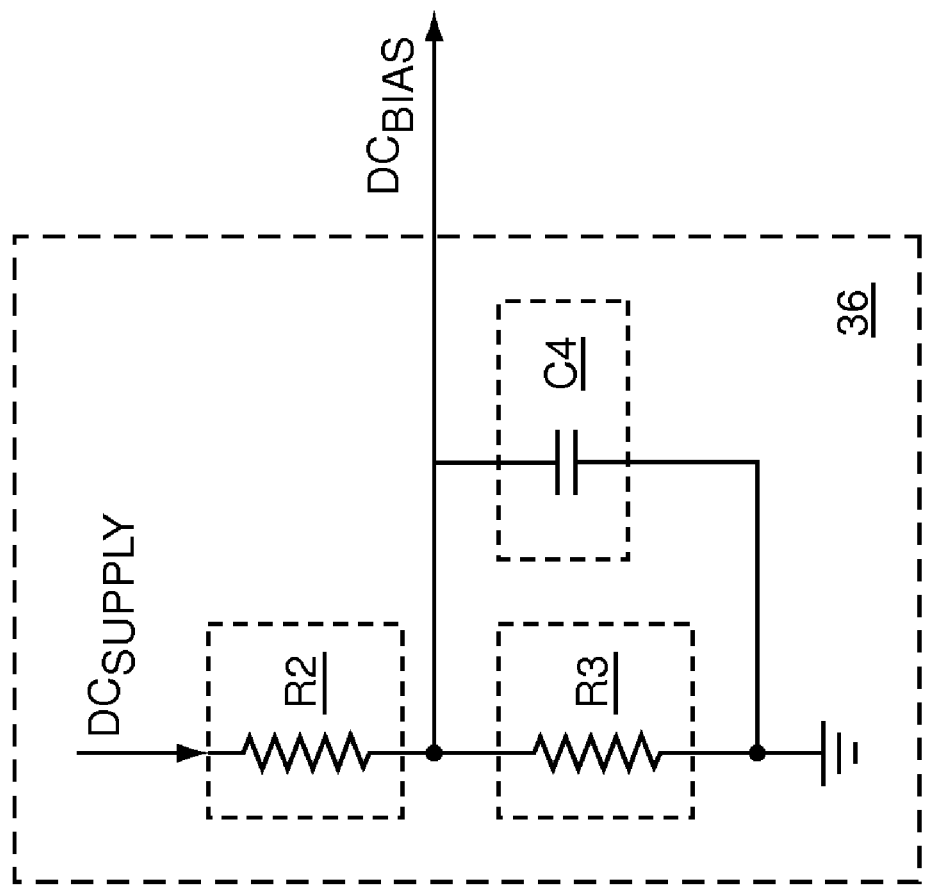

FIG. 11 shows details of the DC bias circuitry illustrated in FIG. 8.

Figure 12:
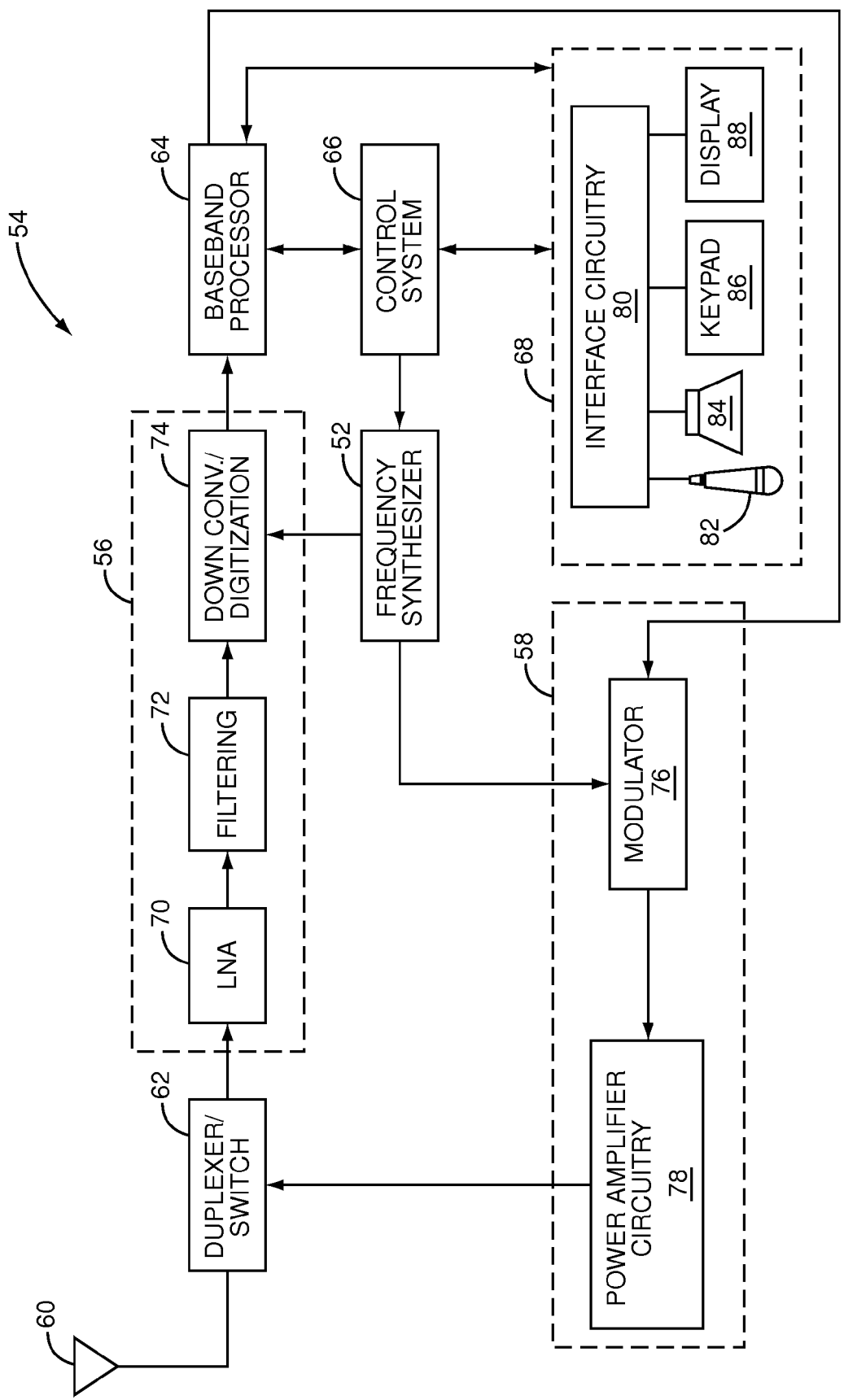

FIG. 12 shows an application example of the present invention used in a mobile terminal.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention is a self-biasing negative transconductance oscillator that uses self-biasing circuitry to regulate a current source that feeds negative transconductance circuitry and DC bias circuitry to apply a DC bias between control inputs and outputs of the negative transconductance circuitry. A current source setpoint is based on the voltage swing of the oscillator, which can then be controlled by the magnitude of the DC power supply that powers the oscillator. The voltage swing and current consumption of the oscillator can be reduced by lowering the supply voltage; however, a larger voltage swing reduces phase noise. Therefore, the present invention enables a trade-off between phase noise and current consumption. Since the current source is self-biasing, biasing and filtering circuitry can be eliminated, further reducing current consumption, cost, and complexity.

In one embodiment of the present invention, the negative transconductance circuitry includes a pair of p-type metal oxide semiconductor (PMOS) cross-coupled field effect transistors (FETs). The sources of the FETs are coupled to the current source, the drains of the FETs provide the oscillator outputs, and the gates of the FETs are cross-coupled to the drains through capacitive elements; therefore, the gates can oscillate at a higher common mode voltage than the drains, which allows the voltage swing at the drains to be larger before the FETs enter a triode-like "on" state. When FETs enter the triode state their impedance drops significantly. This low impedance can short across the LC tank circuit reducing the quality factor (Q) of the tank and contributing noise. Limiting the magnitude of the gate to source voltage of the FETs limits the percentage of the oscillation cycle that the FETs spend in the triode region and thus reduces the noise contribution of the FETs and allows for less power consumption for a given noise requirement.

Figure 1:
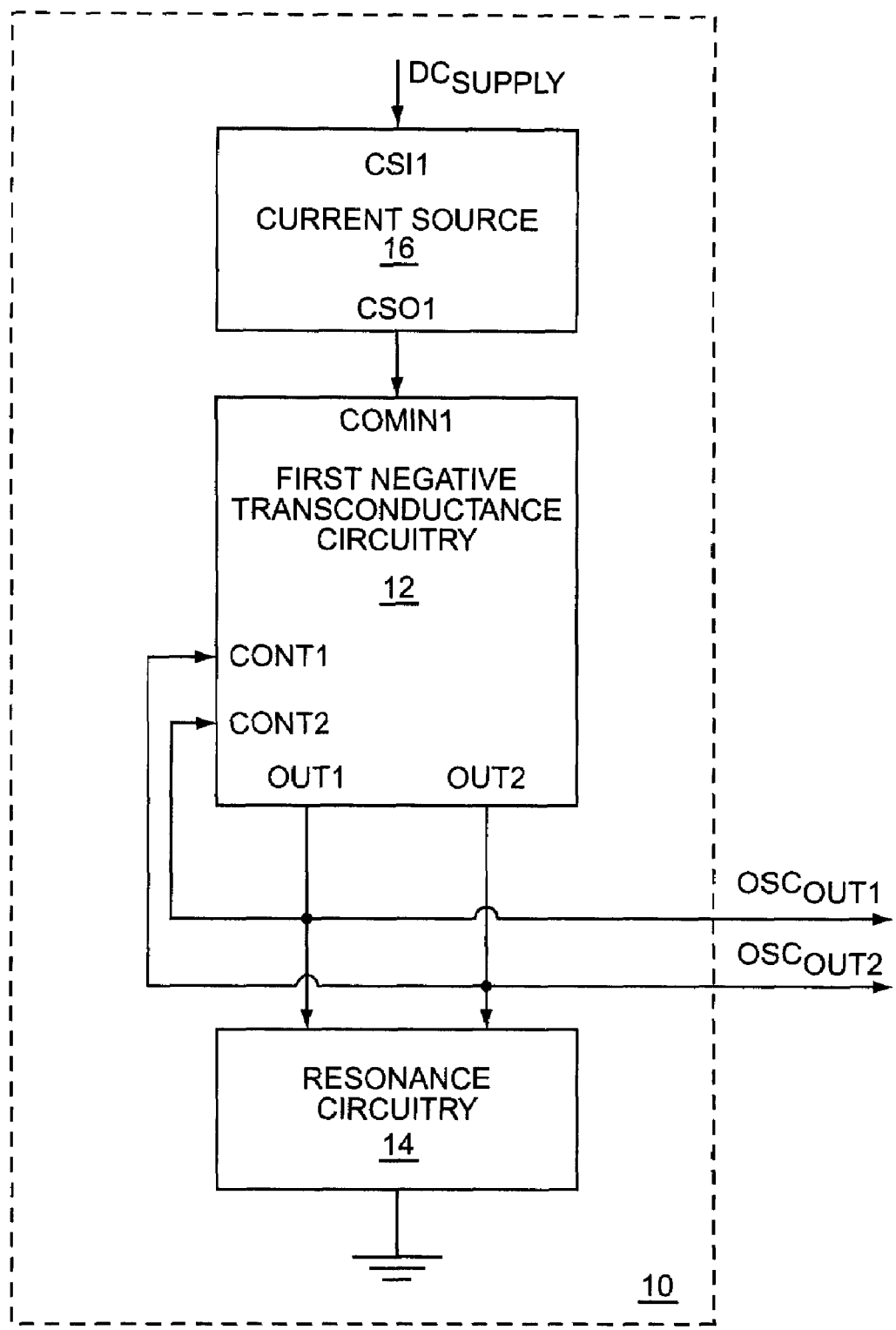
FIG. 1 shows a negative transconductance oscillator according to the prior art.

FIG. 1 shows a negative transconductance oscillator 10 according to the prior art. First negative transconductance circuitry 12 has a first common input COMIN1, a first control input CONT1, a second control input CONT2, a first output OUT1, and a second output OUT2. The first and second outputs OUT1, OUT2 are coupled to resonance circuitry 14. The first output OUT1 is coupled to the second control input CONT2 and provides a first oscillator output signal $OSC_{OUT1}$. The second output OUT2 is coupled to the first control input CONT1 and provides a second oscillator output signal $OSC_{OUT2}$. A current source 16 has a first current source input CSI1, which is coupled to a DC power supply $DC_{SUPPLY}$. The current source 16 has a first current source output CSO1 which is coupled to the first common input COMIN1 of the first negative transconductance circuitry 12. The current source 16 provides a constant current to the first negative transconductance circuitry 12. The resonance circuitry 14 has a resonant frequency, which is the frequency of the first and second oscillator output signals $OSC_{OUT1}$, $OSC_{OUT2}$. The cross coupling of the first and second outputs OUT1, OUT2 to the first and second control inputs CONT1, CONT2 provides a negative transconductance, which maintains circuit oscillation at the resonant frequency of the resonance circuitry 14. The resonance circuitry 14 is coupled to GROUND.

Figure 2:
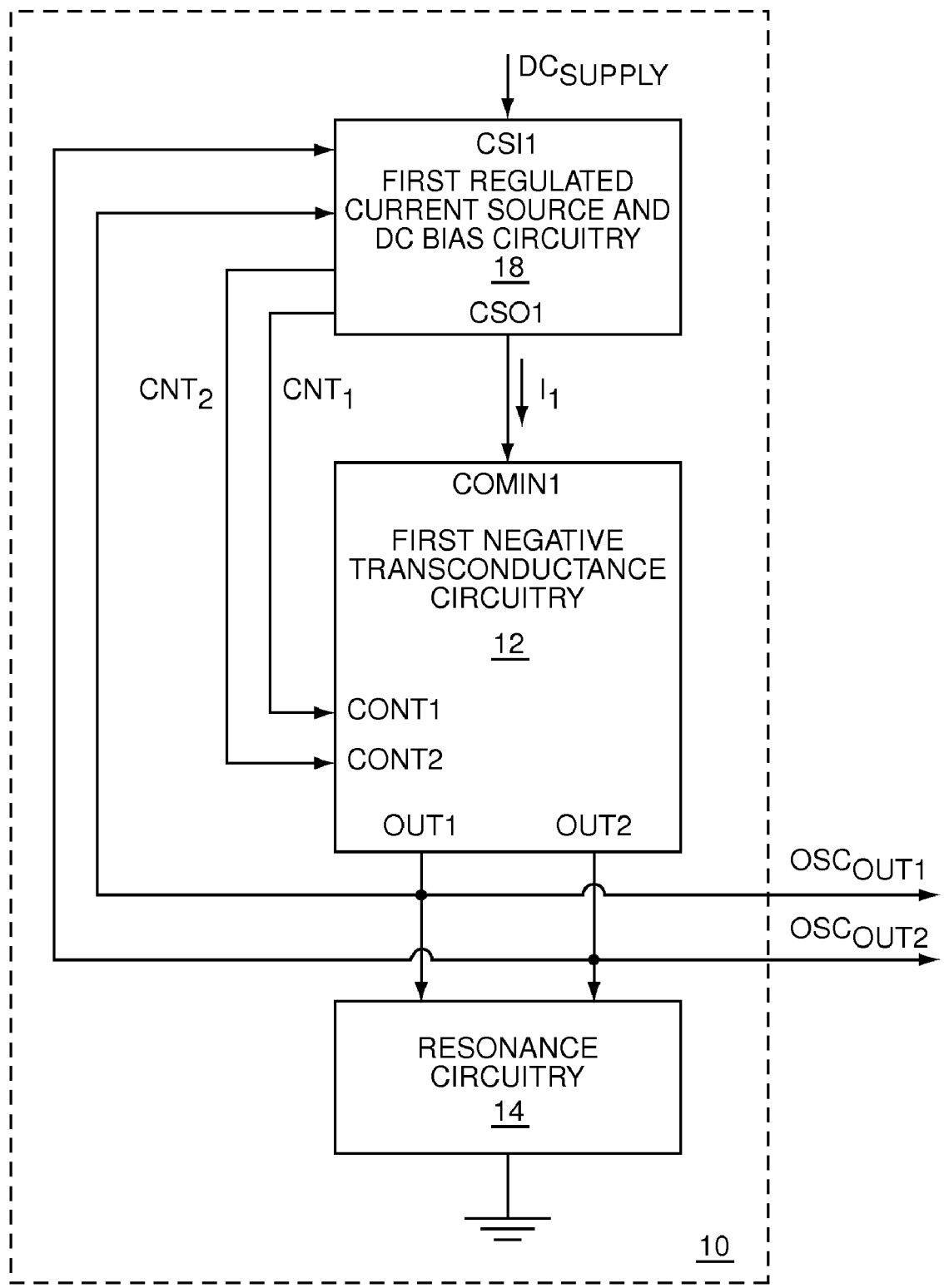
FIG. 2 shows a negative transconductance oscillator according to a first embodiment of the present invention.

FIG. 2 shows a negative transconductance oscillator 10 according to a first embodiment of the present invention. First regulated current source and DC bias circuitry 18 replaces the current source 16 illustrated in FIG. 1. Instead of cross coupling the first and second control inputs CONT1, CONT2 to the first and second outputs OUT1, OUT2 as illustrated in FIG. 1, the first and second control inputs CONT1, CONT2 are cross coupled to the first and second outputs OUT1, OUT2 through the first regulated current source and DC bias circuitry 18, which provides DC blocking circuitry and allows a DC bias voltage to be developed between the first and second outputs OUT1, OUT2 and the second and first control inputs CONT2, CONT1, respectively. The control signals to the first and second control inputs CONT1, CONT2 are a first control input signal $CNT_1$ and a second control input signal $CNT_2$. The first regulated current source and DC bias circuitry 18 provides a first regulated current $I_1$ to the first negative transconductance circuitry 12. The first regulated current $I_1$ is regulated by the first and second oscillator output signals $OSC_{OUT1}$, $OSC_{OUT2}$ and the DC power supply $DC_{SUPPLY}$.

Figure 3:
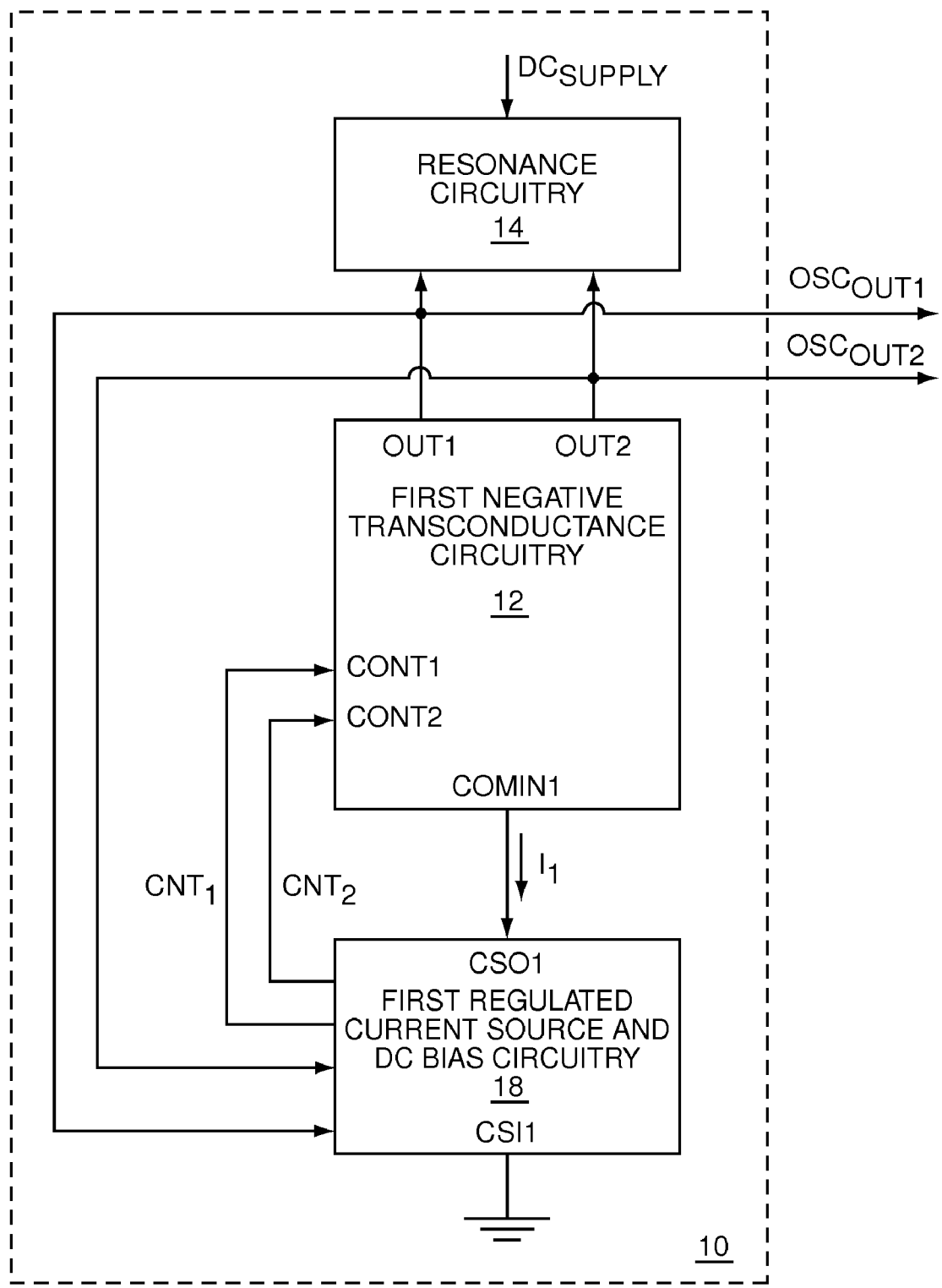
FIG. 3 shows a negative transconductance oscillator according to a second embodiment of the present invention.

FIG. 3 shows a negative transconductance oscillator 10 according to a second embodiment of the present invention. Instead of being coupled to the DC power supply $DC_{SUPPLY}$ as illustrated in FIG. 2, the first current source input CSI1 is coupled to GROUND. Additionally, instead of being coupled to GROUND as illustrated in FIG. 2, the resonance circuitry 14 is coupled to the DC power supply $DC_{SUPPLY}$.

Figure 4:
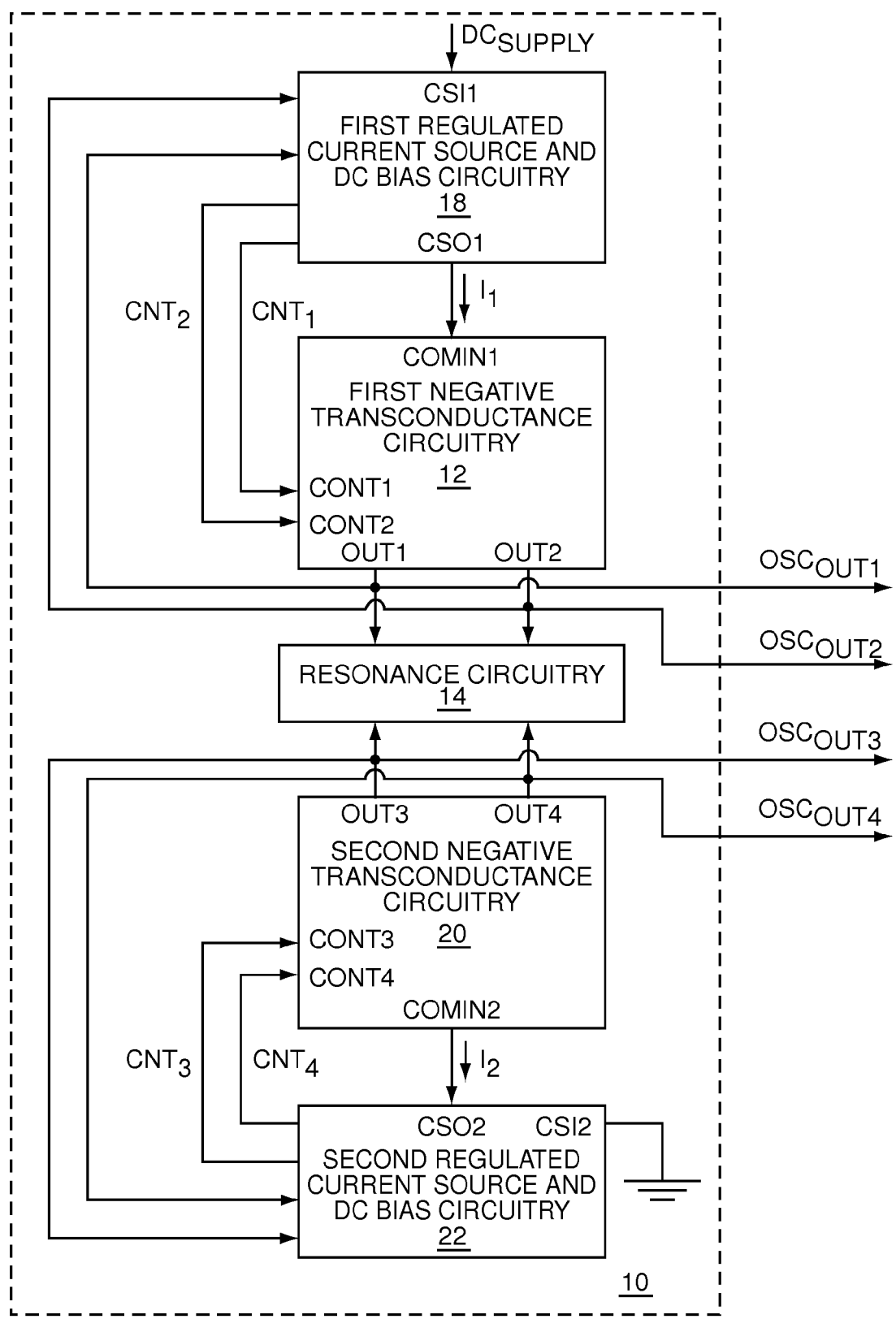
FIG. 4 shows a negative transconductance oscillator according to a third embodiment of the present invention.

FIG. 4 shows a negative transconductance oscillator 10 according to a third embodiment of the present invention. Second negative transconductance circuitry 20 and second regulated current source and DC bias circuitry 22 are added to the first embodiment of the present invention illustrated in FIG. 2. Third and fourth control inputs CONT3, CONT4 are cross coupled to third and fourth outputs OUT3, OUT4 through the second regulated current source and DC bias circuitry 22. The third and fourth outputs OUT3, OUT4 provide third and fourth oscillator output signals $OSC_{OUT3}$, $OSC_{OUT4}$. A second current source input CSI2 is coupled to GROUND, and a second current source output CSO2 is coupled to a second common input COMIN2 to provide a second regulated current $I_2$. The control signals feeding the third and fourth control inputs CONT3, CONT4 are third and fourth control input signals $CNT_3$, $CNT_4$. The first, second, third, and fourth outputs OUT1, OUT2, OUT3, OUT4 are coupled to the resonance circuitry 14.

Figure 5:
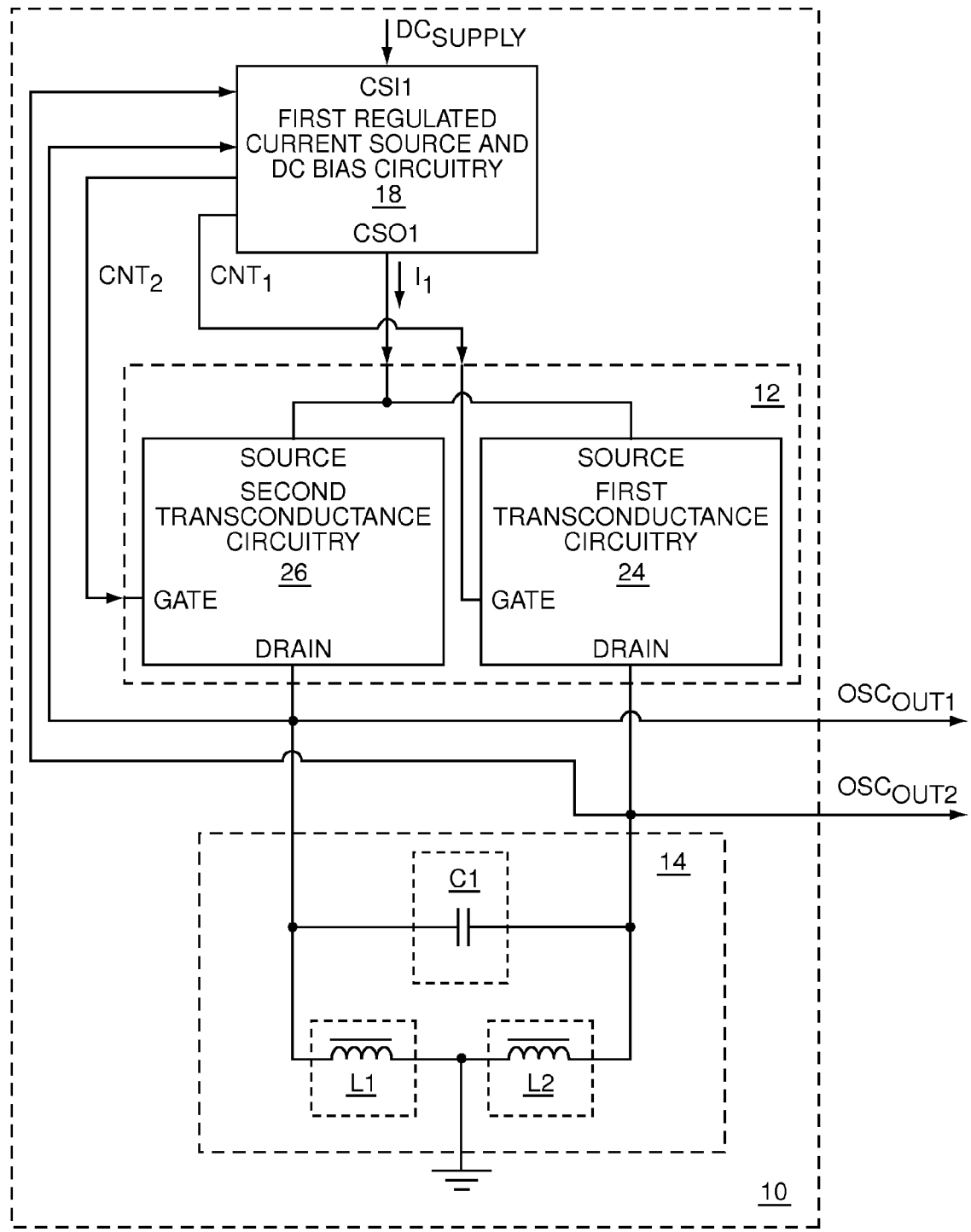
FIG. 5 shows details of the first negative transconductance circuitry and the resonance circuitry illustrated in FIG. 2.

FIG. 5 shows details of the first negative transconductance circuitry 12 and the resonance circuitry 14 illustrated in FIG. 2. The first negative transconductance circuitry 12 includes a first transconductance circuit 24 and a second transconductance circuit 26. A gate GATE of the first transconductance circuit 24 receives the first control input signal $CNT_1$, and a gate GATE of the second transconductance circuit 26 receives the second control input signal $CNT_2$. Sources SOURCE of the first and second transconductance circuits 24, 26 receive the first regulated current $I_1$. A drain DRAIN of the first transconductance circuit 24 provides the second oscillator output signal $OSC_{OUT2}$, and a drain DRAIN of the second transconductance circuit 26 provides the first oscillator output signal $OSC_{OUT1}$. The resonance circuitry 14 includes a first inductive element L1 and a second inductive element L2 coupled in series to create a centertapped inductive element, which is coupled in parallel with a first capacitive element C1. The centertap of the centertapped inductive element is coupled to GROUND.

Figure 6:
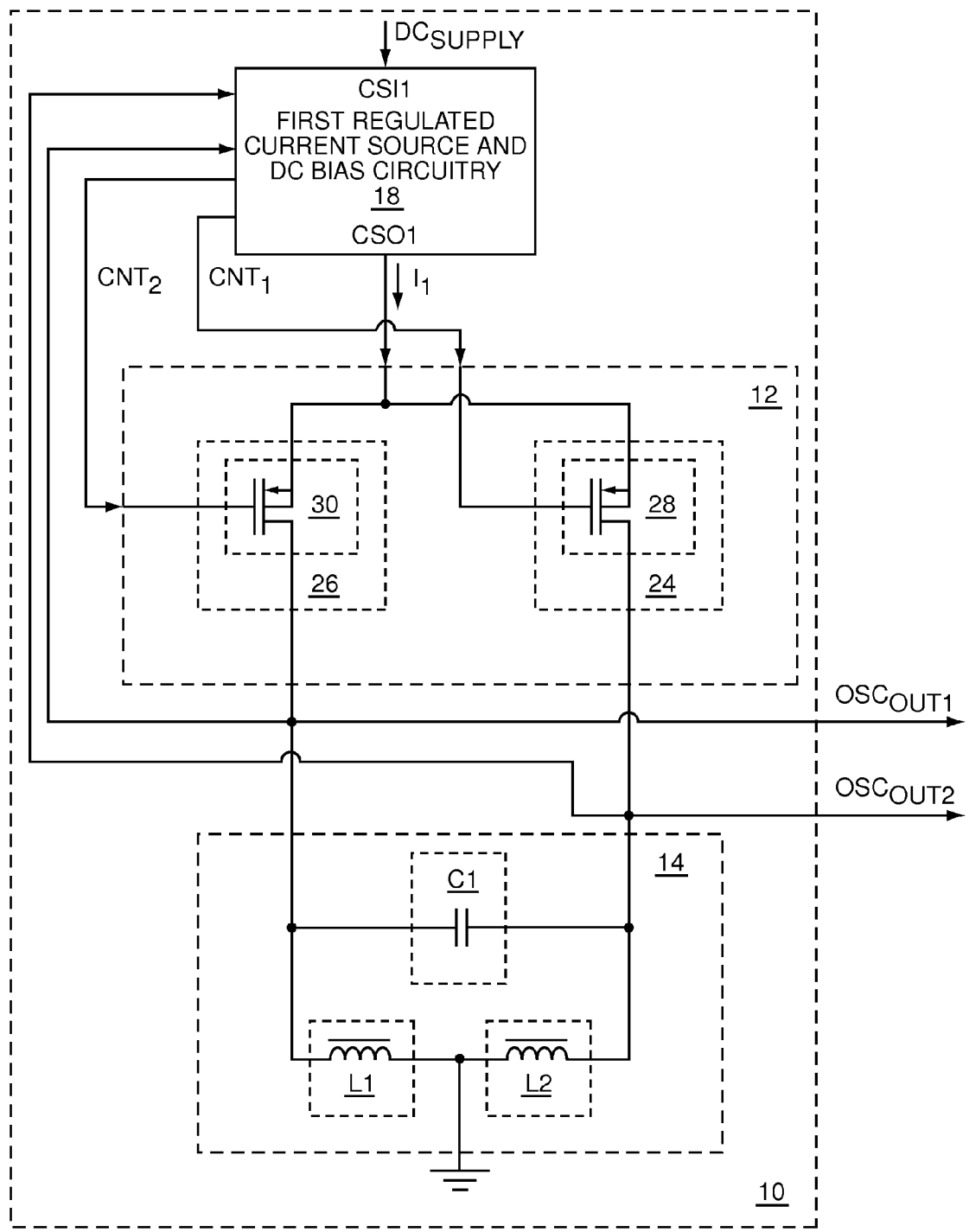
FIG. 6 shows details of the first transconductance circuit and the second transconductance circuit illustrated in FIG. 5.
Figure 7:
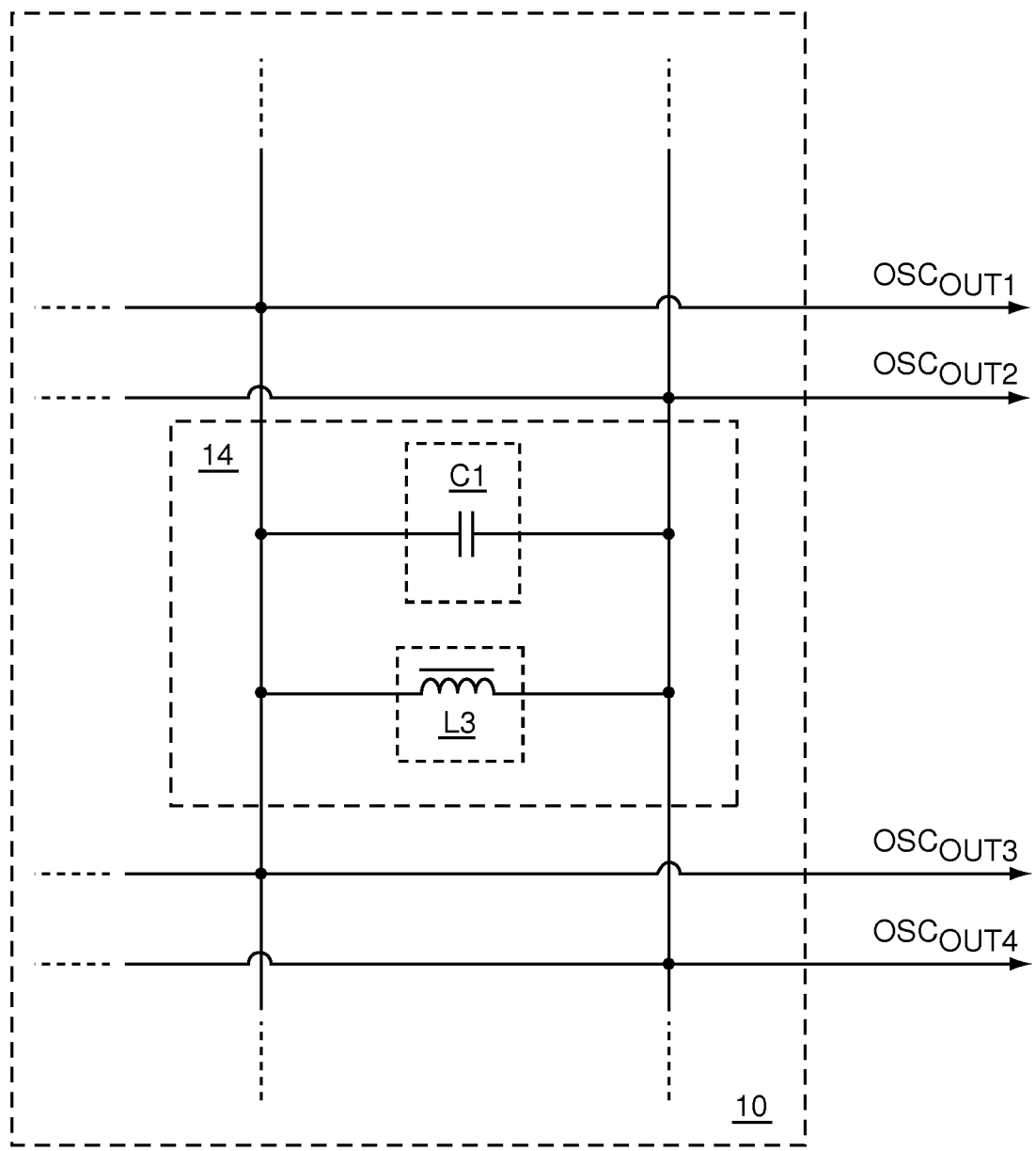
FIG. 7 shows details of the resonance circuitry illustrated in FIG. 4.

FIG. 6 shows details of the first transconductance circuit 24 and the second transconductance circuit 26 illustrated in FIG. 5. The first transconductance circuit 24 includes a first PMOS transistor element 28, and the second transconductance circuit 26 includes a second PMOS transistor element 30. FIG. 7 shows details of the resonance circuitry 14 illustrated in FIG. 4. The resonance circuitry 14 includes the first capacitive element C1 coupled in parallel with a third inductive element L3.

FIG. 8 shows details of the first regulated current source and DC bias circuitry 18 illustrated in FIG. 2. The first regulated current source and DC bias circuitry 18 includes a voltage controlled current source 32, which provides the first current source input CSI1 and the first current source output CSO1. The voltage controlled current source 32 includes a current source control input CSC, which receives a current source control signal HSC. Low side voltage limiting circuitry 34 receives a DC bias signal $DC_{BIAS}$ from DC bias circuitry 36. The low side voltage limiting circuitry 34 provides a DC bias and low side voltage limiting to the first and second control input signals $CNT_1$, $CNT_2$. High side voltage limiting circuitry 38 receives the first and second control input signals $CNT_1$, $CNT_2$, and provides the current source control signal HSC. First DC blocking circuitry 40 is coupled between the first control input CONT1 and the second output OUT2, and second DC blocking circuitry 42 is coupled between the second control input CONT2 and the first output OUT1.

FIG. 9 adds bootstrap circuitry 44 and shows details of the low side voltage limiting circuitry 34, the high side voltage limiting circuitry 38, the first DC blocking circuitry 40, and the second DC blocking circuitry 42 illustrated in FIG. 8. The first and second DC blocking circuitry 40, 42 include second and third capacitive elements C2, C3, respectively. The low side voltage limiting circuitry 34 includes a first diode element CR1 coupled between the DC bias circuitry 36 and the first control input CONT1 and a second diode element CR2 coupled between the DC bias circuitry 36 and the second control input CONT2. The high side voltage limiting circuitry 38 includes a third diode element CR3 coupled between the current source control input CSC and the first control input CONT1, and a fourth diode element CR4 coupled between the current source control input CSC and the second control input CONT2. The bootstrap circuitry 44 is coupled between the current source control input CSC and GROUND to cause the voltage controlled current source 32 to provide initial starting current to the first negative transconductance circuitry 12 to start the oscillator.

The second and third capacitive elements C2, C3 develop a DC bias voltage, which is provided by the DC bias signal through the first and second diode elements CR1, CR2. The bias voltage appears between the first and second control inputs CONT1, CONT2 and the first and second outputs OUT1, OUT2, which may allow transconductance elements in the first negative transconductance circuitry 12 to operate in an "off" state for a larger portion of an oscillator period and may allow the voltage swing at the first and second outputs OUT1, OUT2 to be larger before the first negative transconductance circuitry 12 enters into a triode-like "on" state. The first and second outputs OUT1, OUT2 are alternating current (AC) coupled to the first and second control inputs CONT1, CONT2 through the second and third capacitive elements C2, C3; therefore, the AC components of the first and second oscillator output signals $OSC_{OUT1}$, $OSC_{OUT2}$ appear at the first and second control input signals $CNT_1$, $CNT_2$. Negative excursions of the first and second control input signals $CNT_1$, $CNT_2$ are limited by the DC bias signal $DC_{BIAS}$ and the first and second diode elements CR1, CR2. The first and second input control signals $CNT_1$, $CNT_2$ are rectified by the third and fourth diode elements CR3, CR4 to provide the current source control signal HSC; therefore, as the magnitudes of the first and second oscillator output signals $OSC_{OUT1}$, $OSC_{OUT2}$ increase, the magnitude of the current source control signal HSC increases, which reduces the first regulated current $I_1$. This current reduction leads to a decrease in the magnitudes of the first and second oscillator output signals $OSC_{OUT1}$, $OSC_{OUT2}$, which leads to a decrease in the magnitude of the current source control signal HSC, thereby regulating the magnitudes of the first and second oscillator output signals $OSC_{OUT1}$, $OSC_{OUT2}$.

FIG. 10 shows details of the bootstrap circuitry 44 and the voltage controlled current source 32, and an alternate embodiment of the low side voltage limiting circuitry 34 illustrated in FIG. 9. The bootstrap circuitry 44 includes a first resistive element R1, which may have a very high value of resistance. Instead of the first and second diode elements CR1, CR2, the low side voltage limiting circuitry 34 includes first and second n-type metal oxide semiconductor (NMOS) transistor elements 46, 48, which are configured as diode elements. The voltage controlled current source 32 includes a third PMOS transistor element 50. A source of the third PMOS transistor element 50 is coupled to the DC power supply $DC_{SUPPLY}$. A drain of the third PMOS transistor element 50 is coupled to the first common input COMIN1, and a gate of the third PMOS transistor element 50 receives the current source control signal HSC.

FIG. 11 shows details of the DC bias circuitry 36 illustrated in FIG. 8. A second resistive element R2 is coupled in series with a third resistive element R3 to form a resistor divider, which is coupled between the DC power supply $DC_{SUPPLY}$ and GROUND. A fourth capacitive element C4 is coupled in parallel with the third resistive element R3 to provide filtering. The division point of the resistor divider provides the DC bias signal $DC_{BIAS}$.

Alternate embodiments of the present invention may use different circuitry to regulate the first regulated current $I_1$ based on the first and second oscillator output signals $OSC_{OUT1}$, $OSC_{OUT2}$. Alternate circuitry may be used to provide a DC bias voltage between the first and second outputs OUT1, OUT2 and the first and second control inputs CONT1, CONT2.

An application example of a quadrature RF power amplifier is its use in a frequency synthesizer 52 in a mobile terminal 54, the basic architecture of which is represented in FIG. 12. The mobile terminal 54 may include a receiver front end 56, a radio frequency transmitter section 58, an antenna 60, a duplexer or switch 62, a baseband processor 64, a control system 66, the frequency synthesizer 52, and an interface 68. The receiver front end 56 receives information bearing radio frequency signals from one or more remote transmitters provided by a base station. A low noise amplifier (LNA) 70 amplifies the signal. A filter circuit 72 minimizes broadband interference in the received signal, while down conversion and digitization circuitry 74 down converts the filtered, received signal to an intermediate or baseband frequency signal, which is then digitized into one or more digital streams. The receiver front end 56 typically uses one or more mixing frequencies generated by the frequency synthesizer 52. The baseband processor 64 processes the digitized received signal to extract the information or data bits conveyed in the received signal. This processing typically comprises demodulation, decoding, and error correction operations. As such, the baseband processor 64 is generally implemented in one or more digital signal processors (DSPs).

On the transmit side, the baseband processor 64 receives digitized data, which may represent voice, data, or control information, from the control system 66, which it encodes for transmission. The encoded data is output to the transmitter 58, where it is used by a modulator 76 to modulate a carrier signal that is at a desired transmit frequency. Power amplifier circuitry 78 amplifies the modulated carrier signal to a level appropriate for transmission, and delivers the amplified and modulated carrier signal to the antenna 60 through the duplexer or switch 62.

A user may interact with the mobile terminal 54 via the interface 68, which may include interface circuitry 80 associated with a microphone 82, a speaker 84, a keypad 86, and a display 88. The interface circuitry 80 typically includes analog-to-digital converters, digital-to-analog converters, amplifiers, and the like. Additionally, it may include a voice encoder/decoder, in which case it may communicate directly with the baseband processor 64. The microphone 82 will typically convert audio input, such as the user's voice, into an electrical signal, which is then digitized and passed directly or indirectly to the baseband processor 64. Audio information encoded in the received signal is recovered by the baseband processor 64 and converted by the interface circuitry 80 into an analog signal suitable for driving the speaker 84. The keypad 86 and display 88 enable the user to interact with the mobile terminal 54, input numbers to be dialed, address book information, or the like, as well as monitor call progress information.

Those skilled in the art will recognize improvements and modifications to the preferred embodiments of the present invention. All such improvements and modifications are considered within the scope of the concepts disclosed herein and the claims that follow.

What is claimed is:

1. An oscillator circuit comprising:
    a first negative transconductance circuit comprising:
        a first control input adapted to receive a first control signal;
        a second control input adapted to receive a second control signal;
        a first common input adapted to receive a first current signal;
        a first output adapted to provide a first output signal based on the first control signal and the first current signal; and
        a second output adapted to provide a second output signal based on the second control signal and the first current signal;
    a resonance circuit coupled between the first output and the second output and having a resonant frequency, such that the first output and the second output present a negative transconductance to the resonance circuit; and
    a first current source and direct current (DC) bias circuit: comprising:
        DC bias circuitry having a DC bias output adapted to provide a DC bias signal based on a first DC reference signal and a second DC reference signal;
        a first low side limiting and bias circuit coupled between the DC bias output and the first control input; and
        a second low side limiting and bias circuit coupled between the DC bias output and the second control input; and
    adapted to:
        provide the first control signal based on the second output signal and the DC bias signal;
        provide the second control signal based on the first output signal and the DC bias signal; and
        provide the first current signal based on the first DC reference signal and at least one of a group consisting of the first control signal and the second control signal.

2. The oscillator circuit of claim 1 wherein the first negative transconductance circuit comprises:
    a first transistor element comprising:
        a first source coupled to the first common input;
        a first gate coupled to the first control input; and
        a first drain coupled to the first output; and
    a second transistor element comprising:
        a second source coupled to the first common input;
        a second gate coupled to the second control input; and
        a second drain coupled to the second output.

3. The oscillator circuit of claim 2 wherein the first transistor element comprises a first p-type metal oxide semiconductor (PMOS) transistor element and the second transistor element comprises a second PMOS transistor element.

4. The oscillator circuit of claim 1 wherein the first current source and DC bias circuit further comprises:
    a first DC blocking circuit coupled between the first control input and the second output; and
    a second DC blocking circuit coupled between the second control input and the first output.

5. The oscillator circuit of claim 4 wherein the first DC blocking circuit comprises a first capacitive element and the second DC blocking circuit comprises a second capacitive element.

6. The oscillator circuit of claim 4 wherein a first DC bias signal is across the first DC blocking circuit and a second DC bias signal is across the second DC blocking circuit.

7. The oscillator circuit of claim 1 wherein the first low side limiting and bias circuit comprises a first diode element and the second low side limiting and bias circuit comprises a second diode element.

8. The oscillator circuit of claim 7 wherein the first diode element comprises a first n-type metal oxide semiconductor (NMOS) transistor element and the second diode element comprises a second NMOS transistor element.

9. The oscillator circuit of claim 1 wherein the resonance circuit comprises a capacitive element coupled between the first output and the second output.

10. The oscillator circuit of claim 1 wherein the resonance circuit comprises an inductive element coupled between the first output and the second output.

11. The oscillator circuit of claim 1 wherein the second DC reference signal is approximately ground.

12. The oscillator circuit of claim 1 wherein the resonance circuit is coupled to the second DC reference signal.

13. The oscillator circuit of claim 12 wherein a magnitude of the first DC reference signal minus a magnitude of the second DC reference signal is positive.

14. The oscillator circuit of claim 12 wherein a magnitude of the first DC reference signal minus a magnitude of the second DC reference signal is negative.

15. The oscillator circuit of claim 12 wherein the resonance circuit comprises a center tapped inductive element coupled between the first output and the second output, and the center tapped inductive element is coupled to the second DC reference signal.

16. The oscillator circuit of claim 1 further comprising:
    a second negative transconductance circuit comprising:
        a third control input adapted to receive a third control signal;
        a fourth control input adapted to receive a fourth control signal;
        a second common input adapted to receive a second current signal;
        a third output adapted to provide a third output signal based on the third control signal and the second current signal; and
        a fourth output adapted to provide a fourth output signal based on the fourth control signal and the second current signal;
    the resonance circuit coupled between the third output and the fourth output; and
    a second current source and DC bias circuit adapted to:
        provide the third control signal based on the fourth output signal, the first DC reference signal, and the second DC reference signal;
        provide the fourth control signal based on the third output signal, the first DC reference signal, and the second DC reference signal; and provide the second current signal based on the second DC reference signal and at least one of a group consisting of the third control signal and the fourth control signal.

17. An oscillator circuit comprising:

a first negative transconductance circuit comprising:
- a first control input adapted to receive a first control signal;
- a second control input adapted to receive a second control signal;
- a first common input adapted to receive a first current signal;
- a first output adapted to provide a first output signal based on the first control signal and the first current signal; and
- a second output adapted to provide a second output signal based on the second control signal and the first current signal;

a resonance circuit coupled between the first output and the second output and having a resonant frequency, such that the first output and the second output present a negative transconductance to the resonance circuit; and a first current source and direct current (DC) bias circuit:
comprising a common current source adapted to:
- receive a first DC reference signal;
- receive a current source control signal based on at least one of a group consisting of the first control signal and the second control signal; and
- provide the first current signal based on the current source control signal and the first DC reference signal; and adapted to:
- provide the first control signal based on the second output signal, the first DC reference signal, and a second DC reference signal;
- provide the second control signal based on the first output signal, the first DC reference signal, and the second DC reference signal; and
- provide the first current signal based on the first DC reference signal and at least one of the group consisting of the first control signal and the second control signal.

18. The oscillator circuit of claim 17 wherein the current source control signal is further based on the second DC reference signal.

19. The oscillator circuit of claim 17 wherein the common current source is voltage controlled and the current source control signal is substantially voltage based.

20. The oscillator circuit of claim 17 wherein the common current source comprises a current source control input adapted to receive the current source control signal, and the first current source and DC bias circuit further comprises:
- a first high side limiting circuit coupled between the current source control input and the first control input; and
- a second high side limiting circuit coupled between the current source control input and the second control input.

21. The oscillator circuit of claim 20 wherein the first high side limiting circuit comprises a first diode element and the second high side limiting circuit comprises a second diode element.

22. The oscillator circuit of claim 17 wherein the common current source comprises a transistor element comprising:
- a source adapted to receive the first DC reference signal;
- a gate adapted to receive the current source control signal; and
- a drain adapted to provide the first current signal.

23. A method comprising:
- providing a control and negative transconductance circuit, and a resonance circuit, which has a resonant frequency;
- controlling a first current signal based on a first direct current (DC) reference signal and at least one of a group consisting of a first control signal and a second control signal;
- providing a first output signal based on the first control signal, the first current signal, and the resonance circuit;
- providing a second output signal based on the second control signal, the first current signal, and the resonance circuit;
- providing the first control signal to a first control input based on the second output signal and a DC bias signal;
- providing the second control signal to a second control input based on the first output signal and the DC bias signal;
- providing DC bias circuitry having a DC bias output adapted to provide the DC bias signal based on the first DC reference signal and a second DC reference signal;
- providing a first low side limiting and bias circuit coupled between the DC bias output and the first control input; and
- providing a second low side limiting and bias circuit coupled between the DC bias output and the second control input.

* * * * *